United States Patent
Tsujita et al.

(10) Patent No.: US 9,632,246 B2
(45) Date of Patent: Apr. 25, 2017

(54) OPTO-ELECTRIC HYBRID BOARD (71) Applicant: NITTO DENKO CORPORATION, Ibaraki-shi, Osaka (JP)

(72) Inventors: Yuichi Tsujita, Ibaraki (JP); Yasuto Ishimaru, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/893,245

(22) PCT Filed: Mar. 31, 2014

(86) PCT No.: PCT/JP2014/059399
§ 371 (c)(1),
(2) Date: Nov. 23, 2015

(87) PCT Pub. No.: WO2014/196252
PCT Pub. Date: Dec. 11, 2014

(65) Prior Publication Data
US 2016/0178839 A1 Jun. 23, 2016

(30) Foreign Application Priority Data

Jun. 6, 2013 (JP) .................................. 2013-120088

(51) Int. Cl.
*G02B 6/12* (2006.01)
*H05K 1/02* (2006.01)
*G02B 6/43* (2006.01)

(52) U.S. Cl.
CPC ........... *G02B 6/12002* (2013.01); *G02B 6/43* (2013.01); *H05K 1/0203* (2013.01); *H05K 1/028* (2013.01);
(Continued)

(58) Field of Classification Search
CPC .... G02B 6/12002; G02B 6/43; H05K 1/0274; H05K 1/02; H05K 1/09; H05K 1/111;
(Continued)

(56) References Cited

U.S. PATENT DOCUMENTS 8,142,672 B2 3/2012 Hodono
2007/0031091 A1* 2/2007 Mitamura ............ G02B 6/4201
385/88

(Continued)

FOREIGN PATENT DOCUMENTS

JP 2006-330117 A 12/2006
JP 2009-265342 A 11/2009
(Continued)

OTHER PUBLICATIONS

Notification of Transmittal of Translation of the Internationational Preliminary Report om Patentability (Form PCT/IB/338) issued in counterpart International Application No. PCT/JP2014/059399 mailed Dec. 17, 2015 with Forms PCT/IB/373 and PCt/ISA/237. (6 pages).

(Continued)

*Primary Examiner* — Ellen Kim
(74) *Attorney, Agent, or Firm* — Westerman, Hattori, Daniels & Adrian, LLP (57) ABSTRACT

There is provided an opto-electric hybrid board in which a metal reinforcement layer is in intimate contact with an insulative layer of a flexible circuit board without an adhesive layer interposed therebetween, the metal reinforcement layer allowing the proper mounting of an element while deformation due to pressing load applied during the mounting is suppressed. In the opto-electric hybrid board, a flexible double-sided circuit board in which electrical interconnect lines are formed on the front and back surfaces of an insulative layer having flexibility is used as an electric (Continued)

circuit board. A metal reinforcement layer is formed by plating on at least part of the electrical interconnect line on the back surface side which corresponds to a mounting pad on the front surface side. An optical waveguide is formed in contact with the electrical interconnect line on the back surface side of the flexible double-sided circuit board.

4 Claims, 6 Drawing Sheets

(52) U.S. Cl.
CPC . *H05K 1/0274* (2013.01); *H05K 2201/10121* (2013.01)

(58) Field of Classification Search
CPC .......... H05K 1/189; H05K 3/32; H05K 3/341; H05K 2201/09445; H05K 3/303; H05K 3/4652; H01L 51/0097; H01L 27/3276
USPC .............................. 385/14, 24, 27, 39–40, 49
See application file for complete search history.

(56) References Cited

U.S. PATENT DOCUMENTS

| | | | |
|---|---|---|---|
| 2008/0236876 | A1* | 10/2008 | Kodama ................. G02B 6/43 174/260 |
| 2009/0269704 | A1 | 10/2009 | Hodono |
| 2009/0297096 | A1* | 12/2009 | Hodono ............... G02B 6/4214 385/14 |
| 2014/0016896 | A1* | 1/2014 | Hanazono ................ G02B 6/12 385/14 |

FOREIGN PATENT DOCUMENTS

| | | |
|---|---|---|
| JP | 2010-266598 A | 11/2010 |
| JP | 2011-48150 A | 3/2011 |

OTHER PUBLICATIONS

International Search Report dated Jul. 1, 2014, issued in counterpart Application No. PCT/JP2014/059399 (1 page).

* cited by examiner

OPTO-ELECTRIC HYBRID BOARD

TECHNICAL FIELD

The present invention relates to an opto-electric hybrid board in which a flexible circuit board and an optical waveguide are stacked together and in which an element, such as an optical element and an IC chip, is mounted on the flexible circuit board.

BACKGROUND ART

Figure 7:
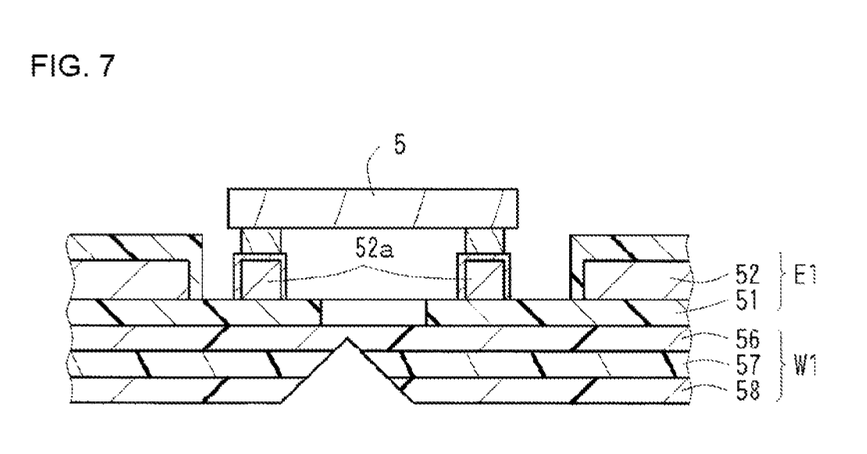
FIG. 7 is a vertical sectional view schematically showing a conventional opto-electric hybrid board.

With the increase in the amount of transmission information, optical interconnect lines in addition to electrical interconnect lines have been used in recent electronic devices and the like. As an example of such a technique, an opto-electric hybrid board as shown in FIG. 7 has been proposed (see PTL 1, for example). This opto-electric hybrid board includes: a flexible circuit board E1 including an insulative layer 51 made of polyimide and the like, and an electrical interconnect line 52 formed on the front surface of the insulative layer 51; an optical waveguide (optical interconnect line) W1 (including an under cladding layer 56, a core 57 and an over cladding layer 58) made of epoxy resin and the like and stacked on the back surface (surface opposite from the surface with the electrical interconnect line 52 formed thereon) of the insulative layer 51; and an optical element 5 mounted on a predetermined portion (mounting pad 52a) of the electrical interconnect line 52. In this opto-electric hybrid board, both the flexible circuit board E1 and the optical waveguide W1 are flexible. To meet the requirement for the size reduction of recent electronic devices and the like, the opto-electric hybrid board is suitable, for example, for use in a small space when in a bent position and for use in a movable section such as a hinge.

RELATED ART DOCUMENT

Patent Document

PTL 1: JP-A-2011-048150

SUMMARY OF INVENTION

However, when the optical element 5 is mounted on the electrical interconnect line 52 of the flexible circuit board E1, both the flexible circuit board E1 and the optical waveguide W1, which are flexible, are deformed by the pressing load applied during the mounting process. This makes it difficult to perform a precise mounting process, resulting in a mounting failure in some cases.

To solve such a difficulty, the present inventors have hit upon the idea of providing a metal reinforcement layer directly on part of the back surface (surface where the optical waveguide W1 is formed) of the insulative layer 51 of the flexible circuit board E1 which corresponds to a mounting portion (mounting pad 52a) of the optical element 5. In other words, the present inventors have used the metal reinforcement layer to suppress the deformation due to the pressing load applied during the mounting of the optical element 5.

However, the use of a metal such as nickel having high rigidity (resistance to deformation) as the material of the metal reinforcement layer gives rise to a problem such that, when the opto-electric hybrid board is bent, the metal reinforcement layer cannot follow the bending to have cracking therein, so that the insulative layer 51 peels off at the cracking. The provision of an adhesive layer between the insulative layer 51 and the metal reinforcement layer for the purpose of solving the aforementioned problem causes another problem, i.e., a mounting failure of the optical element 5 because the adhesive layer is too soft. The use of a metal containing copper as a main component like the electrical interconnect line 52 provides the metal reinforcement layer which has the good property of following the bending and good adhesion to the insulative layer 51 but which is insufficient in rigidity against the pressing load applied during the mounting.

In view of the foregoing, it is therefore an object of the present invention to provide an opto-electric hybrid board in which a metal reinforcement layer is in intimate contact with an insulative layer of a flexible circuit board without an adhesive layer interposed therebetween and in which the metal reinforcement layer allows the proper mounting of an element while deformation due to the pressing load applied during the mounting of the element is suppressed.

To accomplish the aforementioned object, an opto-electric hybrid board according to the present invention comprises: a flexible circuit board including an insulative layer, and a front electrical interconnect line having a mounting pad and formed on a front surface side of the insulative layer; an element mounted on the mounting pad; and an optical waveguide stacked on a back surface side of the insulative layer, wherein the flexible circuit board is a flexible double-sided circuit board and further includes a back electrical interconnect line formed also on the back surface side of the insulative layer. The opto-electric hybrid board further comprises a metal reinforcement layer formed by plating on at least a part of the back electrical interconnect line which corresponds to a position of the mounting pad. The optical waveguide is in contact with the metal reinforcement layer.

Specifically, in the opto-electric hybrid board according to the present invention, the flexible double-sided circuit board in which the electrical interconnect line is formed also on the back surface of the insulative layer is used as the flexible circuit board. In this flexible double-sided circuit board, the electrical interconnect lines on the front and back surfaces are originally in intimate contact with the insulative layer. Thus, when the opto-electric hybrid board is bent, the electrical interconnect lines on the front and back surfaces do not peel off the insulative layer. The metal reinforcement layer is formed by plating on at least apart of the electrical interconnect line on the back surface side which corresponds to a position of the mounting pad on the front surface side. The electrical interconnect lines and the metal reinforcement layer, both of which are made of metal, are high in conformability to each other. In addition, the metal reinforcement layer is firmly in intimate contact with the electrical interconnect lines because the metal reinforcement layer is formed by plating on the electrical interconnect lines. That is, the metal reinforcement layer is firmly in intimate contact with the insulative layer of the flexible double-sided circuit board without an adhesive layer interposed therebetween but with the electrical interconnect line on the back surface side interposed therebetween. The electrical interconnect lines are soft enough to have flexibility but has rigidity higher than that of the adhesive layer. Thus, deformation due to a pressing load during the mounting of the element on the mounting pad on the front surface side is suppressed by the electrical interconnect line on the back surface side and the metal reinforcement layer. As a result, the element is properly mounted without any mounting failure of the element. Further, when the opto-electric hybrid board is bent, the metal reinforcement layer does not peel off the electrical interconnect line on the back surface side because the metal reinforcement layer is formed by plating on the electrical interconnect line and is firmly in intimate contact with the electrical interconnect line on the back surface side as described above.

In the opto-electric hybrid board according to the present invention, the flexible double-sided circuit board in which the electrical interconnect line is formed also on the back surface of the insulative layer is used as the flexible circuit board. This allows the formation of the metal reinforcement layer by plating on the electrical interconnect line on the back surface side. Thus, the metal reinforcement layer is firmly in intimate contact with the insulative layer of the flexible double-sided circuit board, with the electrical interconnect line on the back surface side interposed therebetween. For this reason, the deformation due to the pressing load during the mounting of the element on the mounting pad is suppressed by the electrical interconnect line on the back surface side and the metal reinforcement layer in the opto-electric hybrid board according to the present invention. As a result, the element is properly mounted without any mounting failure of the element in the opto-electric hybrid board according to the present invention. Further, when the opto-electric hybrid board according to the present invention is bent, the metal reinforcement layer does not peel off the electrical interconnect line on the back surface side because the metal reinforcement layer is formed by plating on the electrical interconnect line and is firmly in intimate contact with the electrical interconnect line on the back surface side as described above.

In particular, when the electrical interconnect line on the back surface side has a thickness in the range of 5 to 15 μm and the metal reinforcement layer has an elasticity modulus of not less than 152 GPa and a thickness in the range of 1 to 20 μm, the opto-electric hybrid board is excellent in flexibility while suppressing the deformation due to the pressing load during the mounting of the element.

Also, when the electrical interconnect line on the front surface side and the electrical interconnect line on the back surface side are connected to each other in the flexible double-sided circuit board, the electrical interconnect line on the back surface side may be used as a grounding wire for the electrical interconnect line on the front surface side. Also, heat generated from the element may be transferred and dissipated through the electrical interconnect line on the front surface side to the electrical interconnect line on the back surface side.

DESCRIPTION OF EMBODIMENTS

Next, embodiments according to the present invention will now be described in detail with reference to the drawings.

Figure 1:
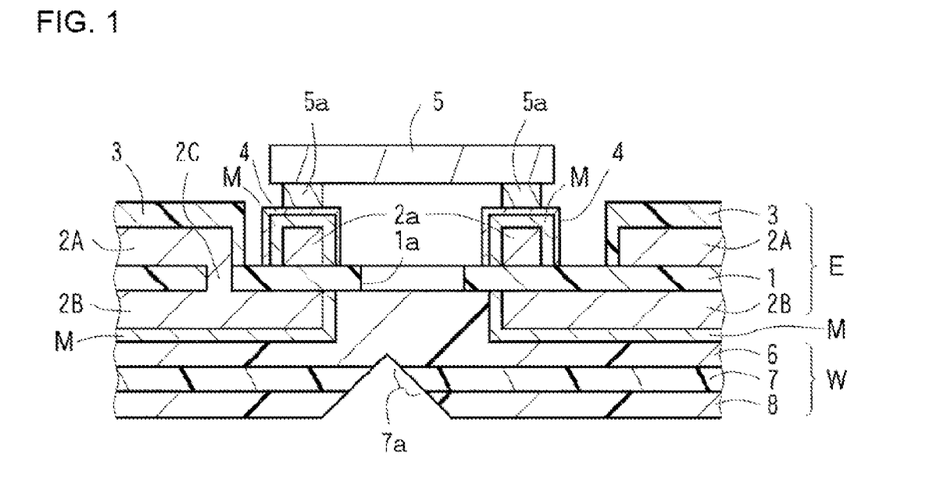
FIG. 1 is a vertical sectional view of principal parts and schematically shows one embodiment of an opto-electric hybrid board according to the present invention.

FIG. 1 is a vertical sectional view around a mounting pad (of principal parts) and schematically shows one embodiment of an opto-electric hybrid board according to the present invention. In the opto-electric hybrid board according to this embodiment, a flexible double-sided circuit board E in which electrical interconnect lines 2A and 2B are formed on the front and back surfaces of an insulative layer 1 having flexibility is used as an electric circuit board. A mounting pad 2a for mounting an element, such as an optical element 5 and an IC chip, thereon is formed in a predetermined portion of the electrical interconnect line 2A on the front surface side. A metal reinforcement layer M is formed by plating on the electrical interconnect line 2B on the back surface side and on the mounting pad 2a. An optical waveguide W is formed in such a condition that an under cladding layer 6 thereof is in contact with the electrical interconnect line 2B on the back surface side of the flexible double-sided circuit board E. In this manner, one significant characteristic of the present invention lies in that the flexible double-sided circuit board E including the electrical interconnect lines 2A and 2B formed on opposite sides is used as the electric circuit board of the opto-electric hybrid board, and the metal reinforcement layer M is formed by plating on at least part of the electrical interconnect line 2B on the back surface side which corresponds to the mounting pad 2a on the front surface side.

Specifically, the electrical interconnect lines 2A and 2B on the front and back surfaces are originally in intimate contact with the insulative layer 1 in the flexible double-sided circuit board E. The metal reinforcement layer M is further formed by plating on the electrical interconnect line 2B on the back surface side. Thus, the electrical interconnect line 2B on the back surface side and the metal reinforcement layer M are firmly in intimate contact with each other. In the opto-electric hybrid board, the metal reinforcement layer M is firmly in intimate contact with the insulative layer 1 of the flexible double-sided circuit board E, with the electrical interconnect line 2B on the back surface side therebetween, because of the aforementioned facts. The metal reinforcement layer M thus suppresses deformation due to the pressing load applied during the mounting of the element such as the optical element 5 on the mounting pad 2a. The element is properly mounted without any mounting failure of the element. Further, when the opto-electric hybrid board is bent, the metal reinforcement layer M does not peel off the electrical interconnect line 2B on the back surface side because the metal reinforcement layer M is formed by plating on the electrical interconnect line 2B and is firmly in intimate contact with the electrical interconnect line 2B on the back surface side as described above.

More specifically, the flexible double-sided circuit board E includes the insulative layer 1 having flexibility, and the electrical interconnect lines 2A and 2B formed on the front and back surfaces of the insulative layer 1, as stated above. The insulative layer 1 preferably has a thickness in the range of 3 to 40 μm from the viewpoints of flexibility, strength and the like, for example, and more preferably in the range of 5 to 25 μm. When the thickness of the insulative layer 1 is too small, the strength thereof tends to decrease. When the thickness of the insulative layer 1 is too great, the insulative layer 1 tends to be poor in flexibility. The electrical interconnect lines 2A and 2B preferably have a thickness in the range of 5 to 15 μm from the viewpoints of flexibility, strength, current-carrying property and the like, for example, and more preferably in the range of 5 to 10 μm. When the thickness of the electrical interconnect lines 2A and 2B is too small, the electrical interconnect lines 2A and 2B tend to give rise to a break therein and a poor current-carrying property. When the thickness of the electrical interconnect lines 2A and 2B is too great, the electrical interconnect lines 2A and 2B tend to be poor in flexibility.

Further, the electrical interconnect line 2A on the front surface side and the electrical interconnect line 2B on the back surface side are connected to each other by via hole plating 2C in this embodiment. Thus, the electrical interconnect line 2B on the back surface side may be used as a grounding wire for the electrical interconnect line 2A on the front surface side. Also, heat generated from the element such as the optical element 5 may be transferred and dissipated through the electrical interconnect line 2A on the front surface side to the electrical interconnect line 2B on the back surface side.

A through hole 1a for an optical path is formed in part of the insulative layer 1 which corresponds to a central portion of the mounted optical element 5. Part of the electrical interconnect line 2A on the front surface side which is other than the mounting pad 2a is covered with a cover lay 3. In this embodiment, a gold plating layer 4 for providing good electrical conductivity is further formed on the surface of the metal reinforcement layer M formed on the mounting pad 2a.

The metal reinforcement layer M preferably has an elasticity modulus of not less than 152 GPa from the viewpoint of requiring rigidity. Examples of such a metal material include nickel, cobalt, chromium, molybdenum, iron, manganese, platinum, tantalum and tungsten. In particular, nickel, cobalt and chromium are preferable because of the ease of formation. The metal reinforcement layer M preferably has a thickness in the range of 1 to 20 μm from the viewpoints of flexibility, strength and the like, more preferably in the range of 3 to 20 μm, and further preferably in the range of 5 to 20 μm. When the thickness of the metal reinforcement layer M is too small, the strength thereof tends to decrease. When the thickness of the metal reinforcement layer M is too great, the metal reinforcement layer M tends to be poor in flexibility.

The optical waveguide W includes a core 7 interposed between the under cladding layer 6 and an over cladding layer 8. The under cladding layer 6 is stacked on the back surface side of the flexible double-sided circuit board E to be in contact with the metal reinforcement layer M formed on the back electrical interconnect line 2B and part of back surface of the insulative layer 1 where the back electrical interconnect line 2B is not formed. Part of the core 7 which corresponds to the central portion of the mounted element such as the optical element 5 is formed to serve as a light reflecting surface 7a inclined at 45 degrees with respect to the axis of the core 7. An optical path is converted by the reflection of light from the light reflecting surface 7a, so that light propagation between the core 7 and the optical element 5 is achieved. In FIG. 1, the reference character 5a designates an electrode of the element such as the optical element 5.

The opto-electric hybrid board is manufactured, for example, in a manner to be described below.

Figure 2A:
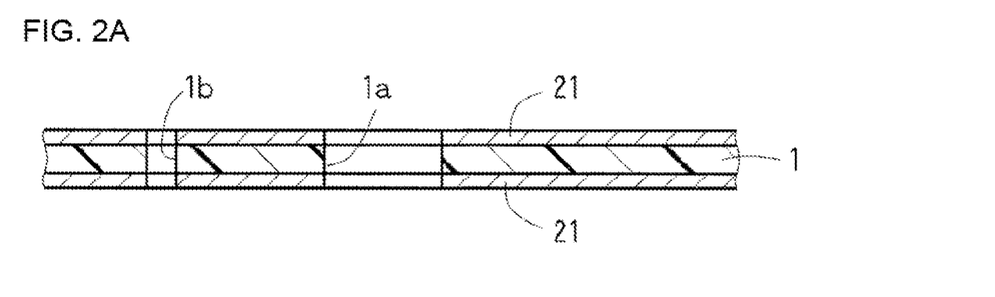
FIGS. 2A to 2C are views schematically illustrating the steps of producing a flexible double-sided circuit board in the opto-electric hybrid board.

First, as shown in FIG. 2A, a base material including the insulative layer 1 made of a resin such as polyimide and copper foil 21 formed on the front and back surfaces of the insulative layer 1 is prepared. The through hole 1a for an optical path and a via hole 1b are formed in the base material.

Figure 2B:
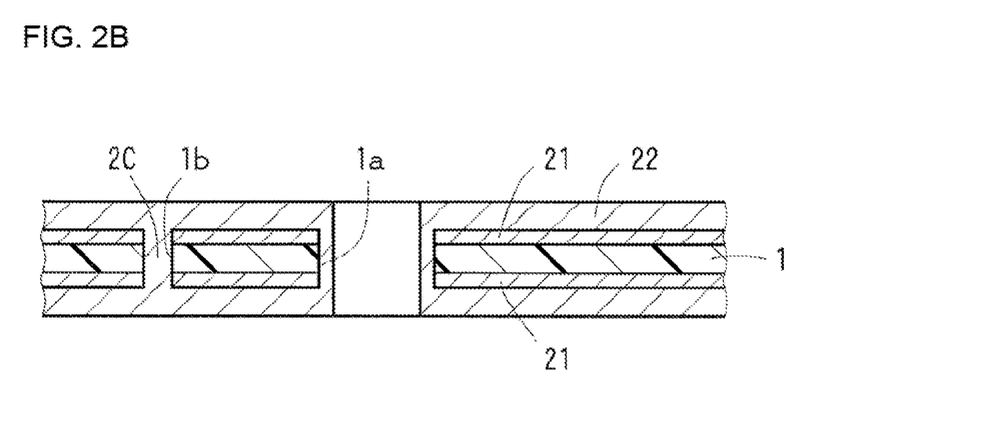

Next, as shown in FIG. 2B, a copper plating layer 22 is formed on the copper foil 21 by an electroplating process until the thickness of the copper plating layer 22 equals the thickness of the electrical interconnect lines 2A and 2B (with reference to FIG. 2C), and the via hole plating 2C is formed in the via hole 1b.

Figure 2C:
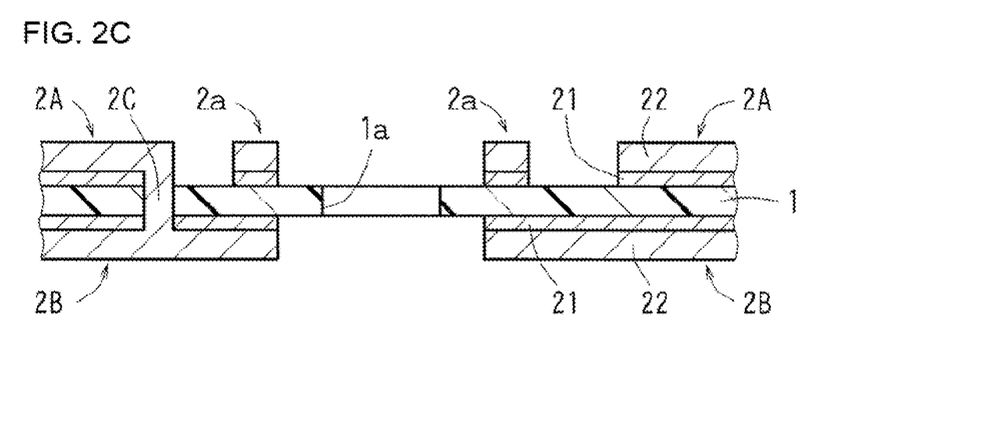

Next, as shown in FIG. 2C, a laminate comprised of the copper foil 21 and the copper plating layer 22 is patterned to form the electrical interconnect line 2A (including the mounting pad 2a) and the electrical interconnect line 2B. This patterning is performed, for example, by covering part of the laminate which becomes the electrical interconnect lines 2A and 2B with a resist, etching away part of the laminate which is not covered with the resist, and then removing the resist.

Figure 3A:
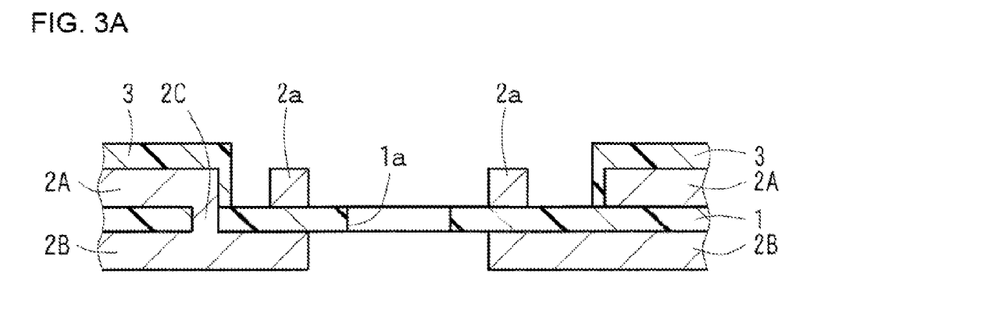
FIGS. 3A to 3C are views schematically illustrating the steps of producing the flexible double-sided circuit board subsequent to FIG. 2.

Thereafter, as shown in FIG. 3A, part of the electrical interconnect line 2A on the front surface side which is other than the mounting pad 2a is covered with the coverlay 3. The coverlay 3 is formed, for example, by a photolithographic method with the use of a photosensitive insulating resin as a coverlay forming material. In FIG. 3A and the subsequent figures, the copper foil 21 and the copper plating layer 22 shown in FIG. 2C are not shown, but the electrical interconnect line 2A (including the mounting pad 2a) and the electrical interconnect line 2B which are formed therefrom are shown.

Figure 3B:
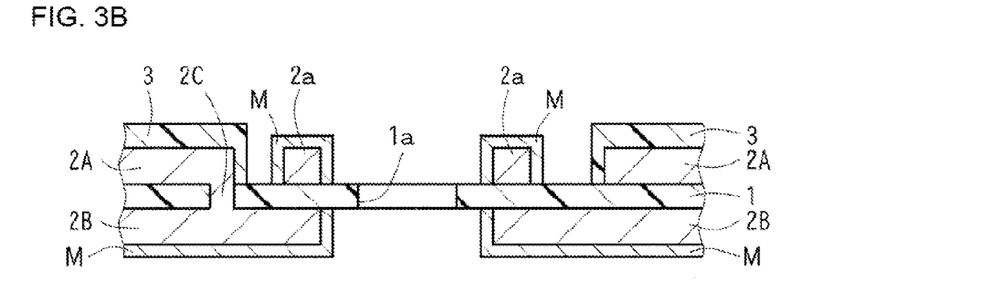

Then, as shown in FIG. 3B, the metal reinforcement layer M is formed by an electroplating process on the electrical interconnect line 2B on the back surface side and the mounting pad 2a which are exposed metal. As stated earlier, the metal reinforcement layer M is preferably made of nickel, cobalt and chromium as the metal material thereof, and preferably has a thickness in the range of 1 to 20 μm.

Figure 3C:
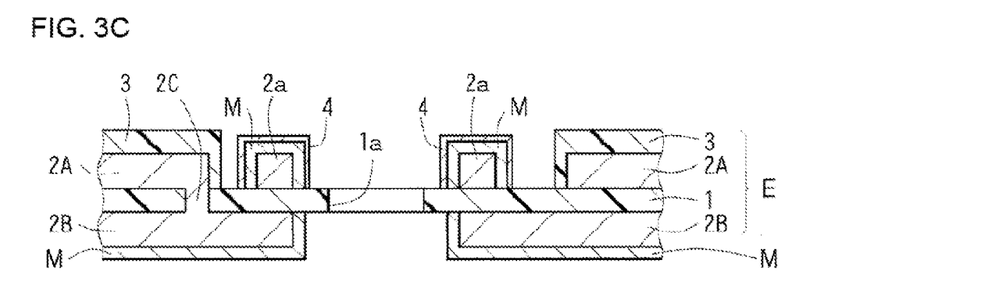

Further, as shown in FIG. 3C, the gold plating layer 4 is formed by an electroplating process on the front surface of the metal reinforcement layer M formed on the mounting pad 2a. The gold plating layer 4 has a thickness in the range of 0.05 to 2 μm, for example. In the electroplating process, the electrical interconnect line 2B on the back surface side which is exposed metal is covered with a resist and the like so that the gold plating layer 4 is not formed thereon. In this manner, the flexible double-sided circuit board E with the metal reinforcement layer M formed thereon is produced.

Figure 4A:
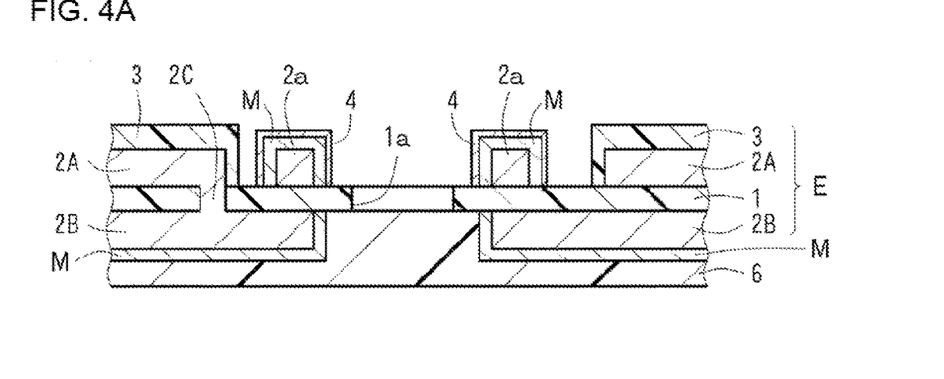
FIGS. 4A to 4C are views schematically illustrating the steps of producing an optical waveguide in the opto-electric hybrid board.

Next, as shown in FIG. 4A, the under cladding layer 6 is formed on the back surface side of the flexible double-sided circuit board E while being in contact with the metal reinforcement layer M which covers the electrical interconnect line 2B on the back surface side. Examples of a material for the formation of the under cladding layer 6 include photosensitive resins and thermosetting resins. The under cladding layer 6 may be produced by a manufacturing method depending on the material. The under cladding layer 6 has a thickness in the range of 1 to 50 μm.

Figure 4B:
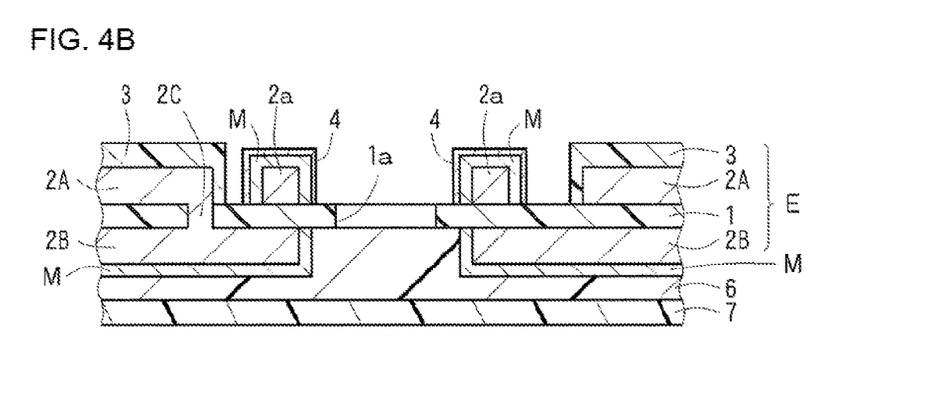

Next, as shown in FIG. 4B, the protruding core 7 having a linear shape is formed on the lower surface of the under cladding layer 6. The core 7 is formed, for example, by a photolithographic method with the use of a photosensitive resin as a forming material thereof. The core 7 has the following dimensions: a thickness in the range of 5 to 60 μm, and a width in the range of 5 to 60 μm, for example.

Figure 4C:
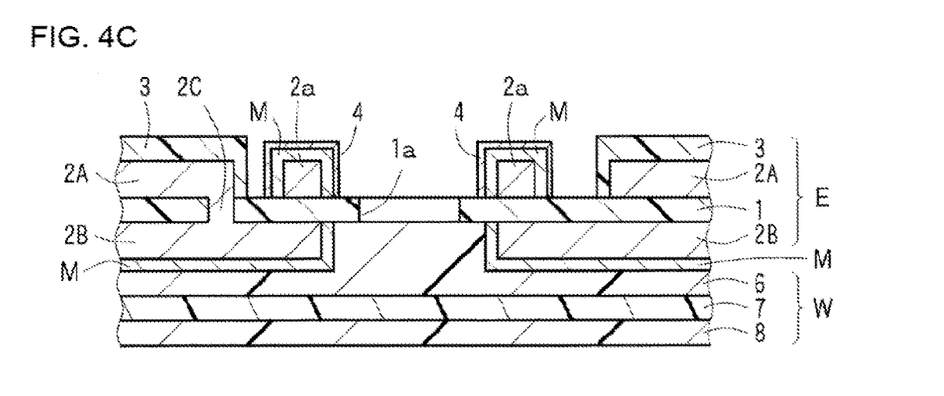

As shown in FIG. 4C, the over cladding layer 8 is further formed on the lower surface of the under cladding layer 6 so as to cover the core 7. Examples of a material for the formation of the over cladding layer 8 include photosensitive resins and thermosetting resins. The over cladding layer 8 may be produced by a manufacturing method depending on the material. The over cladding layer 8 has a thickness (thickness as measured from the core 7) in the range of 3 to 50 μm, for example. In this manner, the optical waveguide W is produced in a stacked manner on the back surface side of the flexible double-sided circuit board E.

Figure 5A:
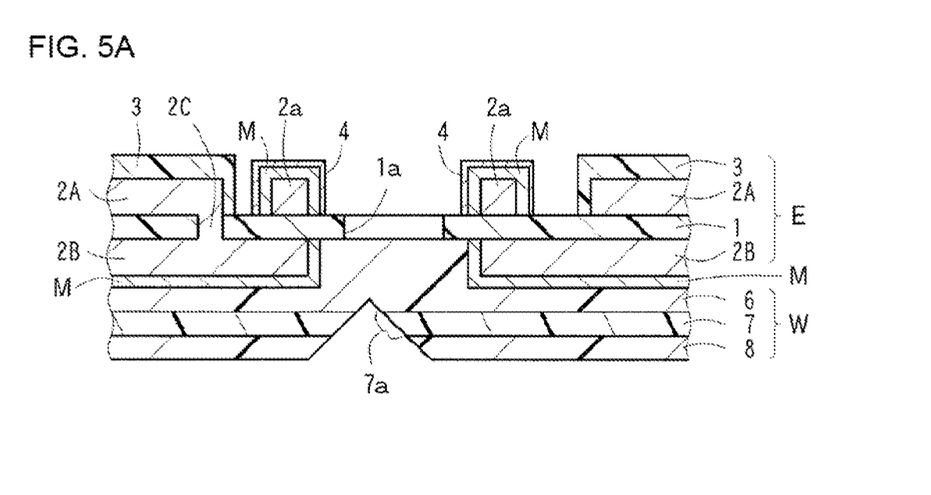
FIG. 5A is a view schematically illustrating the step of forming a light reflecting surface in a core of the optical waveguide.

Thereafter, as shown in FIG. 5A, a predetermined portion of the core 7 is cut from the lower surface side of the over cladding layer 8 by means of a cutting blade, laser beam machining and the like, so that the light reflecting surface 7a inclined at 45 degrees with respect to the axis of the core 7 is formed.

Figure 5B:
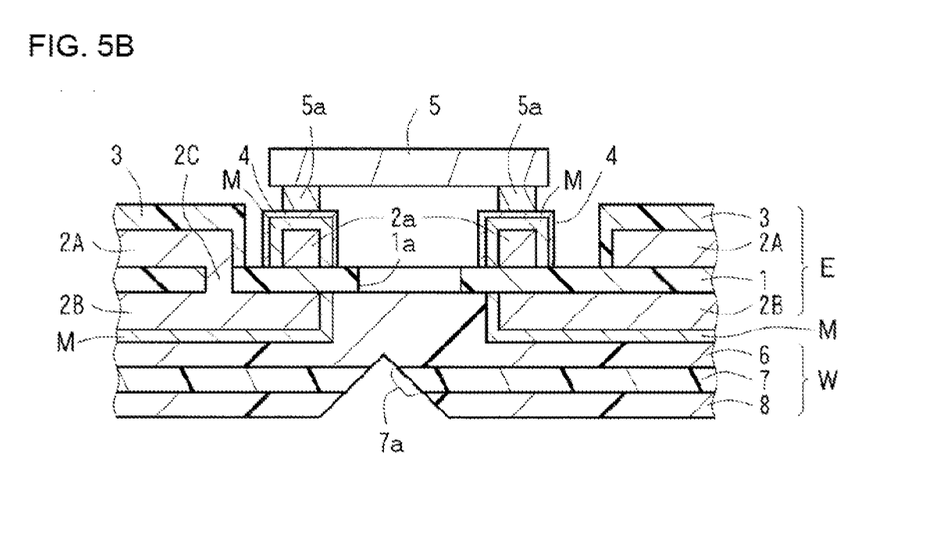
FIG. 5B is a view schematically illustrating the step of mounting an optical element in the opto-electric hybrid board.

Then, as shown in FIG. 5B, an element such as the optical element 5 is mounted on the mounting pad 2a. At this time, a pressing load due to the mounting is applied to the flexible double-sided circuit board E and the optical waveguide W. However, the metal reinforcement layer M suppresses the deformation of the flexible double-sided circuit board E and the optical waveguide W due to the pressing load. Thus, the element is properly mounted without any mounting failure of the element. In this manner, the opto-electric hybrid board is provided.

Figure 6:
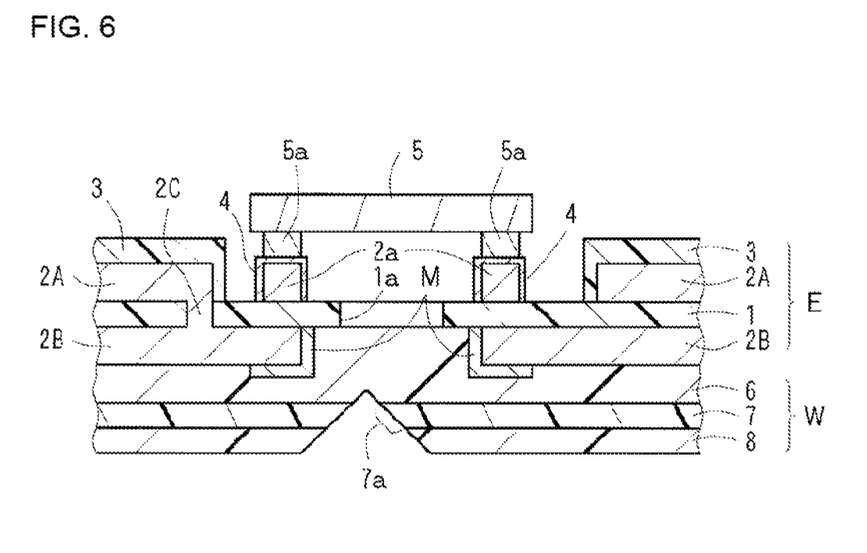
FIG. 6 is a vertical sectional view of principal parts and schematically shows another embodiment of the opto-electric hybrid board according to the present invention.

FIG. 6 is a vertical sectional view around the mounting pad (of principal parts) and schematically shows another embodiment of the opto-electric hybrid board according to the present invention. The opto-electric hybrid board according to this embodiment is configured such that the metal reinforcement layer M in the embodiment shown in FIG. 1 is formed on only part of the electrical interconnect line 2B on the back surface side which corresponds to the mounting pad 2a on the front surface side. Such partial formation of the metal reinforcement layer M is achieved by performing an electroplating process for the formation of the metal reinforcement layer M (with reference to FIG. 3B) while covering part of the electrical interconnect lines 2A and 2B where the metal reinforcement layer M is not formed with a resist and the like. The remaining parts of this embodiment are similar to those of the embodiment shown in FIG. 1. Like reference numerals and characters are used in this embodiment to designate parts similar to those of the embodiment shown in FIG. 1.

The area in which the metal reinforcement layer M is formed in this embodiment is less than that in the embodiment shown in FIG. 11. The opto-electric hybrid board in this embodiment is accordingly slightly poorer in rigidity. However, the deformation due to the pressing load applied during the mounting of the element in this embodiment is sufficiently suppressed because the metal reinforcement layer M is formed in proper locations for the mounting of the element such as the optical element 5. The element is properly mounted without any mounting failure of the element.

The electrical interconnect line 2A on the front surface side and the electrical interconnect line 2B on the back surface side are connected to each other by the via hole plating 2C in the aforementioned embodiments. However, the electrical interconnect lines 2A and 2B on the front and back surface sides need not be connected to each other, as the case may be.

The gold plating layer 4 is formed on the mounting pad 2a in the aforementioned embodiments. However, the gold plating layer 4 need not be formed, as the case may be.

In the aforementioned embodiments, part of the electrical interconnect line 2B on the back surface side where the metal reinforcement layer M is not formed may be covered with a coverlay. This coverlay is formed after the formation of the metal reinforcement layer M and before the formation of the under cladding layer 6. Also, after the formation of the over cladding layer 8, the over cladding layer 8 may be covered with a covering layer such as a coverlay.

The through hole 1a for an optical path is formed in the insulative layer 1 in the aforementioned embodiments. However, when the insulative layer 1 has transparency to light, the through hole 1a for an optical path need not be formed.

Next, an inventive example of the present invention will be described. It should be noted that the present invention is not limited to the inventive example.

EXAMPLES

The opto-electric hybrid board in the embodiment shown in FIG. 6 was produced. In the opto-electric hybrid board, the thickness of the insulative layer made of polyimide was 5 μm, the thickness of the electrical interconnect lines made of copper on the front and back surfaces was 10 μm, the thickness of the metal reinforcement layer made of nickel plating was 3 μm, the thickness of the under cladding layer was 15 μm, the thickness of the core was 50 μm, the width of the core was 50 μm, and the thickness of the over cladding layer (thickness thereof as measured from the core) was 15 μm. The elasticity modulus of the metal reinforcement layer made of nickel plating was 177 GPa. This elasticity modulus was measured using an elasticity modulus measuring machine (MMT-X7 available from Matsuzawa Co., Ltd.).

[Under Cladding Layer and Over Cladding Layer]

Materials for the formation of the under cladding layer and the over cladding layer were prepared by mixing 50 parts by weight of an aliphatic chain modified epoxy resin (EPICLON EXA-4816 available from DIC Corporation), 30 parts by weight of an alicyclic bifunctional epoxy resin (CELLOXIDE 2021P available from Daicel Corporation), 20 parts by weight of a polycarbonate diol (PLACCEL CD205PL available from Daicel Corporation), 2 parts by weight of a photo-acid generator (SP170 available from ADEKA Corporation), and 5 parts by weight of ethyl lactate (available from Musashino Chemical Laboratory, Ltd.) together.

[Core]

A material for the formation of the core was prepared by mixing 50 parts by weight of o-cresol novolac glycidyl ether (YDCN-700-10 available from Nippon Steel & Sumikin Chemical Co., Ltd.), 50 parts by weight of bisphenoxyethanolfluorene diglycidyl ether (OGSOL EG available from Osaka Gas Chemicals Co., Ltd.), 1 part by weight of a photo-acid generator (SP170 available from ADEKA Corporation), and 50 parts by weight of ethyl lactate (available from Musashino Chemical Laboratory, Ltd.) together.

[Mounting of Optical Element]

An ultrasonic mounting machine flip chip bonder (FCB3 available from Panasonic Factory Solutions Co., Ltd.) was used to mount a light-receiving element (photodiode KPDG006HA1 available from Kyosemi Corporation) on the mounting pad of the opto-electric hybrid board in Inventive Example. The mounting conditions were as follows: an element temperature of 150° C., the temperature of the opto-electric hybrid board of 50° C., a pressing load of 1.0

N, an ultrasonic power of 3.0 W, and mounting time of 0.5 second. Then, it was determined that the light-receiving element operated properly. This shows that the light-receiving element was properly mounted without any mounting failure.

Results having tendencies similar to those described above were obtained when the aforementioned metal reinforcement layer was replaced with a metal reinforcement layer made of chromium plating (having an elasticity modulus of 248 GPa), a metal reinforcement layer made of cobalt plating (having an elasticity modulus of 211 GPa), a metal reinforcement layer made of manganese plating (having an elasticity modulus of 159 GPa) and a metal reinforcement layer made of platinum plating (having an elasticity modulus of 152 GPa). Further, results having tendencies similar to those described above were obtained when the thickness of the metal reinforcement layer was changed to 1 µm and 20 µm.

Also, results having tendencies similar to those described above were obtained when the thickness of the electrical interconnect lines made of copper on the front and back surfaces was changed to 5 µm and 15 µm.

Although specific forms in the present invention have been described in the aforementioned example, the aforementioned example should be considered as merely illustrative and not restrictive. It is contemplated that various modifications evident to those skilled in the art could be made without departing from the scope of the present invention.

The opto-electric hybrid board according to the present invention may be used to eliminate a mounting failure of an element such as an optical element.

REFERENCE SIGNS LIST

E Flexible double-sided circuit board
M Metal reinforcement layer
W Optical waveguide 1 Insulative layer
2A and 2B Electrical interconnect lines
2a Mounting pad

What is claimed is:
1. An opto-electric hybrid board comprising:
a flexible double-sided circuit board including
an insulative layer,
a front electrical interconnect line having a mounting pad, the front electrical interconnect line being formed on a front surface side of the insulative layer, and
a back electrical interconnect line formed on a back surface side of the insulative layer;
an element mounted on the mounting pad;
an optical waveguide stacked on the back surface side of the insulative layer; and
a metal reinforcement layer formed by plating on at least a part of the back electrical interconnect line which corresponds to a position of the mounting pad,
wherein an entirety of the metal reinforcement layer is sandwiched between the optical waveguide and the back electrical interconnect line.
2. The opto-electric hybrid board according to claim 1, wherein the back electrical interconnect line has a thickness in the range of 5 to 15 µm, and
wherein the metal reinforcement layer has an elasticity modulus of not less than 152 GPa and a thickness in the range of 1 to 20 µm.
3. The opto-electric hybrid board according to claim 1, wherein the front electrical interconnect line and the back electrical interconnect line are connected to each other in the flexible double-sided circuit board.
4. The opto-electric hybrid board according to claim 2, wherein the front electrical interconnect line and the back electrical interconnect line are connected to each other in the flexible double-sided circuit board.

* * * * *